(12) United States Patent
Song et al.

(10) Patent No.: US 9,835,920 B2
(45) Date of Patent: Dec. 5, 2017

(54) DISPLAY DEVICE

(71) Applicant: SAMSUNG DISPLAY CO., LTD., Yongin-si, Gyeonggi-do (KR)

(72) Inventors: Jaejin Song, Seoul (KR); Yoonjang Kim, Hwaseong-si (KR); Seungsoo Baek, Suwon-si (KR); Changjai Shin, Seongnam-si (KR); Seulbee Lee, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/425,144

(22) Filed: Feb. 6, 2017

(65) Prior Publication Data

US 2017/0285429 A1    Oct. 5, 2017

(30) Foreign Application Priority Data

Apr. 4, 2016   (KR) .......... 10-2016-0041133

(51) Int. Cl.
| | |
|---|---|
| *H01L 27/12* | (2006.01) |
| *G02F 1/1362* | (2006.01) |
| *G09G 3/36* | (2006.01) |
| *G02F 1/1368* | (2006.01) |

(52) U.S. Cl.
CPC ...... *G02F 1/136286* (2013.01); *G02F 1/1368* (2013.01); *G02F 1/136213* (2013.01); *G09G 3/3648* (2013.01); *H01L 27/124* (2013.01); *H01L 27/1248* (2013.01)

(58) Field of Classification Search
CPC ............................. H01L 27/01; H01L 27/013
See application file for complete search history.

(56) References Cited

U.S. PATENT DOCUMENTS

2007/0018168 A1*  1/2007  Oh ................. H01L 27/124
                                                       257/72
2014/0232624 A1    8/2014  Kim et al.

FOREIGN PATENT DOCUMENTS

| KR | 10-2007-0080475 A | 8/2007 |
| KR | 10-2008-0051852 A | 6/2008 |
| KR | 10-2008-0075687 A | 8/2008 |
| KR | 10-2014-0103588 A | 8/2014 |

\* cited by examiner

*Primary Examiner* — Cheung Lee
(74) *Attorney, Agent, or Firm* — Lee & Morse, P.C.

(57) ABSTRACT

A display device includes a plurality of pixels, at least one of which includes a pixel electrode, a switch, a storage electrode, and a storage electrode, and a storage electrode connecting portion. The pixel electrode is in a pixel area corresponding to a first gate line, a second gate line, a first data line, and a second data line. The switch is connected to the first gate line, the first data line, and the pixel electrode. The storage electrode is adjacent to the pixel electrode. The storage electrode connecting portion is connected to the storage electrode and overlaps at least one of the first gate line or the second gate line. At least a portion of the storage electrode connecting portion is substantially parallel to the overlapped one of the first gate line or the second gate line.

23 Claims, 8 Drawing Sheets

DISPLAY DEVICE

CROSS-REFERENCE TO RELATED APPLICATION

Korean Patent Application No. 10-2016-0041133, filed on Apr. 4, 2016, and entitled, "Display Device," is incorporated by reference herein in its entirety.

BACKGROUND

1. Field

One or more embodiments described herein relate to a display device.

2. Description of the Related Art

A liquid crystal display device has a liquid crystal layer between two electrodes. When voltages are applied to the electrodes, liquid crystal molecules in the liquid crystal layer rearrange to control the amount of transmitted light to form an image.

SUMMARY

In accordance with one or more embodiments, a display device includes a plurality of pixels, at least one of the pixels including: pixel electrode in a pixel area corresponding to a first gate line, a second gate line, a first data line, and a second data line; a switch connected to the first gate line, the first data line, and the pixel electrode; a storage electrode adjacent to the pixel electrode; and storage electrode connecting portion connected to the storage electrode and overlapping at least one of the first gate line or the second gate line, at least a portion of the storage electrode connecting portion substantially parallel to the overlapped one of the first gate line or the second gate line.

The storage electrode connecting portion may include a first connecting portion between the first data line and pixel electrode and connected to the storage electrode; a second connecting portion overlapping the first gate line; a third connecting portion overlapping the second gate line; and a fourth connecting portion overlapping the second data line. The fourth connecting portion may be substantially parallel to the second data line. The storage electrode connecting portion and the pixel electrode may be on a same layer. The respective storage electrode connecting portions of the pixels may be connected to one another.

The storage electrode may include a first storage electrode portion that is more adjacent to the second gate line between the first gate line and the second gate line. An end portion of the first storage electrode portion may be connected to the storage electrode connecting portion. The first storage electrode portion may be along a side of the pixel electrode that faces the second gate line.

The storage electrode may include at least one of a second storage electrode portion extending from one end portion of the first storage electrode portion toward the first gate line; a third storage electrode portion extending from another end portion of the first storage electrode portion toward the first gate line; and a fourth storage electrode portion extending from the first storage electrode portion between the one end portion and the another end portion toward the first gate line. At least one of the first, second, third, or fourth storage electrode portions may overlap the pixel electrode.

The switch may include a gate electrode connected to the first gate line, a source electrode connected to the first data line, and a drain electrode connected to the pixel electrode. The source electrode of the switch may have substantially a U shape. Respective convex portions of the source electrodes in the respective pixels may face a same direction. The first data line or the second data line may be between respective storage electrodes of adjacent pixels, and the respective storage electrodes may be connected to each other.

The second data line may be between two adjacent pixels, and a third storage electrode portion in one of the two adjacent pixels and a third storage electrode portion in the other of the two pixels may be connected to each other. The first data line may be between two adjacent pixels, and a first storage electrode in one of the two adjacent pixels and a third storage electrode portion on the other of the two adjacent pixels may be connected to each other.

The display device may include an insulating layer between the storage electrode and the storage electrode connecting portion, the insulating layer including a contact hole to connect the storage electrode and the storage electrode connecting portion. The storage electrode connecting portion may include a transparent conductive material.

The display device may include a light blocking layer on the first data line, second data line, and switch. Another pixel of the plurality of pixels may include another pixel electrode in another pixel area corresponding to the first gate line, the second gate line, the second data line, and a third data line; and another storage electrode adjacent to the another pixel electrode. The another storage electrode may include another first storage electrode portion that is more adjacent to the first gate line between the first gate line and the second gate line. One side of the pixel electrode facing the first gate line may be a longer than another side of the pixel electrode facing the first data line. The first gate line may be driven prior to the second gate line in a single frame period.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
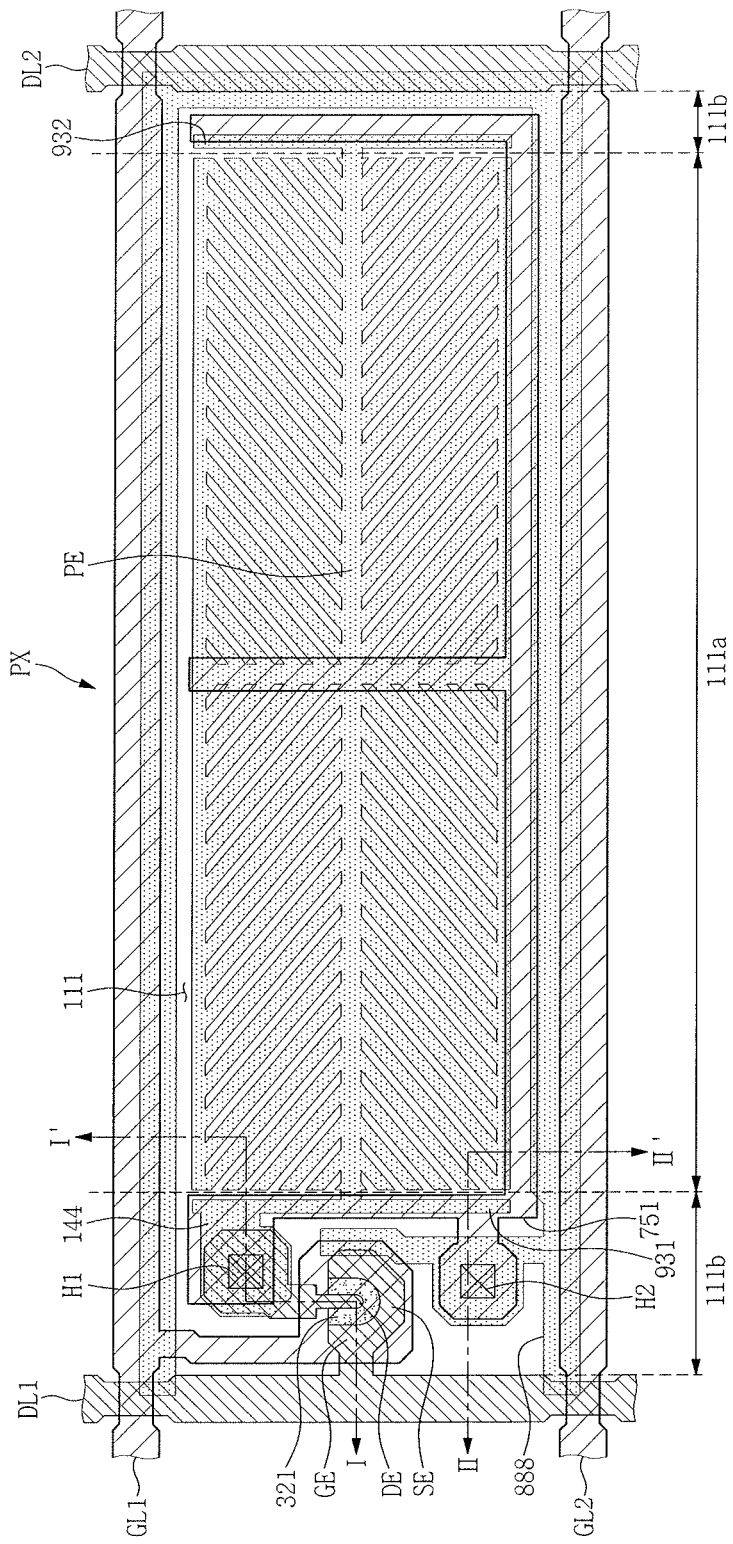
FIG. 1 illustrates an embodiment of a pixel of a display device.

Example embodiments will now be described more fully hereinafter with reference to the accompanying drawings;

however, they may be embodied in different forms and should not be construed as limited to the embodiments herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Figure 2:
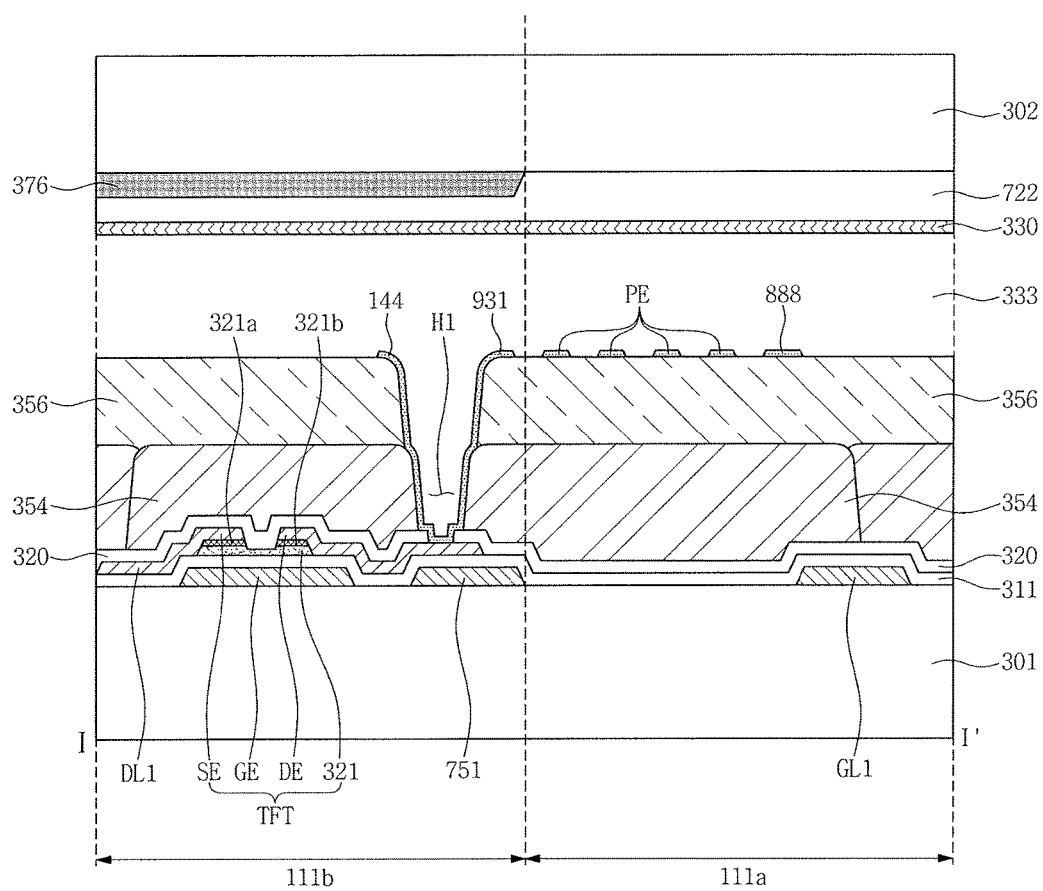
FIG. 2 illustrates a view along section line I-I' in FIG. 1.
Figure 3:
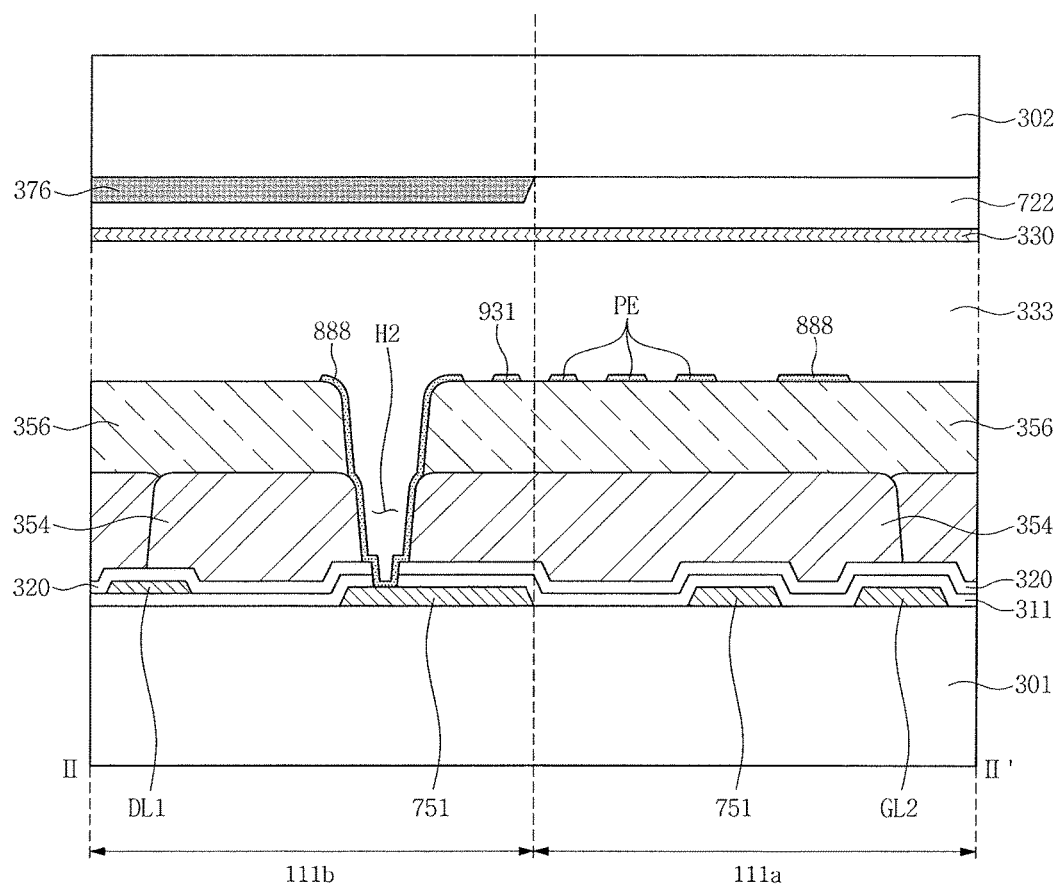
FIG. 3 illustrates a view along section line II-II' in FIG. 1.

FIG. 1 illustrates an embodiment of a pixel, FIG. 2 illustrates a cross-sectional view along line I-I' in FIG. 1, and FIG. 3 is a cross-sectional view along line II-II' in FIG. 1. An exemplary embodiment of a display device includes a plurality of gate lines, a plurality of data lines, and a plurality of pixels. Each of the pixels is connected to a corresponding one of the gate lines and a corresponding one of the data lines. FIG. 1 illustrates one of the plurality of pixels PX provided in the display device and gate lines GL1 and GL2 and data lines DL1 and DL2 disposed in the vicinity of the pixel PX.

Referring to FIGS. 1, 2, and 3, the pixel PX includes a first substrate 301, a switching element TFT, a gate insulating layer 311, a passivation layer 320, a color filter 354, an insulating interlayer 356, a pixel electrode PE, a second substrate 302, a light blocking layer 376, an overcoat layer 722, a common electrode 330, and a liquid crystal layer 333. In an exemplary embodiment, the pixel PX may further include a first polarizer and a second polarizer. When surface of the first substrate 301 and a surface of the second substrate 302 that face each other correspond to upper surfaces of the corresponding substrates, respectively, and surfaces opposite to the upper surfaces correspond to lower surfaces of the corresponding substrates, respectively, the first polarizer may be on the lower surface of the first substrate 301 and the second polarizer may be on the lower surface of the second substrate 302.

A transmission axis of the first polarizer crosses a transmission axis of the second polarizer. One of the transmission axes may be oriented parallel to the gate line GL. In an alternative exemplary embodiment, the LCD device may include the first polarizer or the second polarizer.

The pixel PX is connected to the first gate line GL1 and the first data line DL1. For example, the pixel PX is connected to the first gate line GL1 and the first data line DL1 through the switching element TFT. In an exemplary embodiment, other pixels of the display device may be connected to the second gate line GL2 and the second data line DL2. The first gate line GL1 may be driven prior to the second gate line GL2 in a single frame period.

A switching element TFT and a pixel electrode PE of the pixel PX are in a pixel area 111 of the pixel PX. The pixel area 111 of the pixel PX may be an area defined by the first gate line GL1, the second gate line GL2, the first data line DL1, and the second data line DL2 that are adjacent to one another. Thus, the pixel area 111 may be an area surrounded by the first gate line GL1, the second gate line GL2, the first data line DL1, and the second data line DL2.

The pixel area 111 includes a light emission area 111a and a light blocking area 111b. The light blocking area 111b is covered by the light blocking layer 376. In an exemplary embodiment, the light blocking layer 376 is not in the light emission area 111a. The switching element TFT is in the light blocking area 111b, and the pixel electrode PE is in the light emission area 111a.

The switching element TFT includes a semiconductor layer 321, a gate electrode GE, a source electrode SE, and a drain electrode DE. The gate electrode GE is connected to the first gate line GL1, the source electrode SE is connected to the first data line DL1, and the drain electrode DE is connected to the pixel electrode PE. The drain electrode DE and the pixel electrode PE are connected to each other through a first contact hole H1. The switching element TFT may be a thin film transistor.

The gate electrode GE, the first gate line GL1, the second gate line GL2, and a storage electrode 751 are on the first substrate 301. The gate electrode GE may have a shape protruding from the first gate line GL1 toward the second gate line GL2. The gate electrode GE is between the first gate line GL1 and the second gate line GL2. The gate electrode GE and the first gate line GL1 may be have a unitary construction.

The gate electrode GE may include or be formed of aluminum (Al) or alloys thereof, silver (Ag) or alloys thereof, copper (Cu) or alloys thereof, and/or molybdenum (Mo) or alloys thereof. In an alternative exemplary embodiment, the gate electrode GE may include or be formed of one of chromium (Cr), tantalum (Ta), and titanium (Ti). In an exemplary embodiment, the gate electrode GE may have a multilayer structure including at least two conductive layers with different physical properties.

An end portion of the first gate line GL1 may be connected to another layer or an external driving circuit. The end portion of the first gate line GL1 may have a larger planar area than a planar area of another portion of the first gate line GL1. The first gate line GL1 may include substantially the same material and may have substantially the same structure (e.g., a multilayer structure) as those of the gate electrode GE. The first gate line GL1 and gate electrode GE may be simultaneously formed in the same process.

The second gate line GL2 may have the same structure as the first gate line GL1.

The storage electrode 751 is adjacent to the pixel electrode PE. The storage electrode 751 may overlap the pixel electrode PE. The storage electrode 751 may include substantially the same material and may have substantially the same structure (e.g., a multilayer structure) as the gate electrode GE. The storage electrode 751 and the gate electrode GE may be simultaneously formed in the same process.

A storage voltage is applied to the storage electrode 751. The storage voltage may be the same as a common voltage applied to the common electrode 330. For example, the common voltage is applied to the storage electrode 751 and the common electrode 330.

Figure 4:
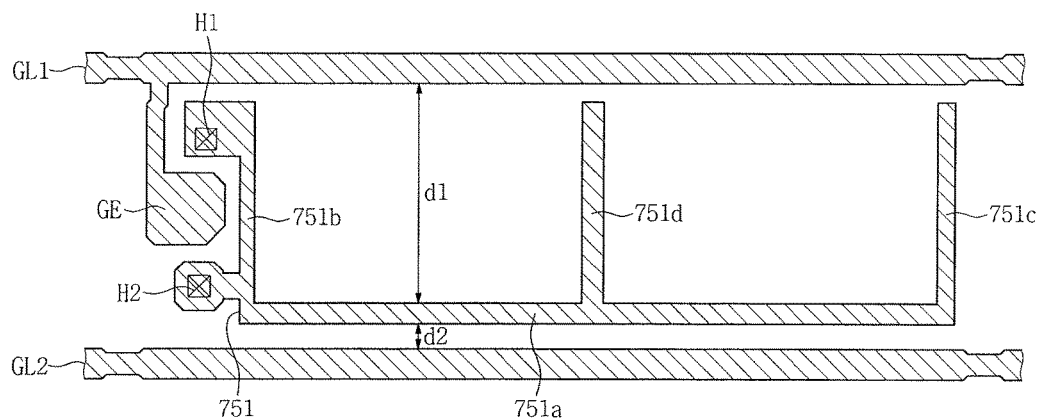
FIG. 4 illustrates an embodiment of a first gate line, a gate electrode, a second gate line, and a storage electrode of FIG. 1.

FIG. 4 illustrates an embodiment of the first gate line GL1, the gate electrode GE, the second gate line GL2, and the storage electrode 751 in FIG. 1. Referring to FIGS. 1 and 4, the storage electrode 751 may include a first storage electrode portion 751a, a second storage electrode portion 751b, a third storage electrode portion 751c, and a fourth storage electrode portion 751d.

The first storage electrode portion 751a may be more adjacent to the second gate line GL2 between the first and second gate lines GL1 and GL2. For example, the first gate line GL1, among the gate lines GL1 and GL2 adjacent to the pixel electrode PE of FIG. 1, is connected to the pixel PX in which the pixel electrode PE is included. The second gate line GL2 is not connected to the pixel PX. The first storage electrode portion 751a of the pixel PX may be more adjacent to the second gate line GL2. For example, as illustrated in FIG. 4, a distance d2 between the first storage electrode portion 751a and the second gate line GL2 may be less than a distance d1 between the first storage electrode portion 751a and the first gate line GL1. In addition, at least a portion of the first storage electrode portion 751a is between the pixel electrode PE and the second gate line GL2 in a horizontal plan view. Effects based on the position of the first storage electrode portion 751a will be described hereinbelow.

The switching element TFT of the pixel PX is turned on by a gate high voltage applied from the first gate line GL1. An image data signal (hereinafter, a data voltage) is applied from the first data line DL1 to the pixel electrode PE by the turned-on switching element TFT. Subsequently, a gate low voltage is applied to the first gate line GL1 such that the switching element TFT is turned off. Accordingly, the data voltage is stored in the pixel electrode PE.

Subsequently, a gate high voltage is applied to the second gate line GL2. Then, a gate low voltage is applied to the second gate line GL2. When the voltage of the second gate line GL2 transitions from the gate high voltage to the gate low voltage, the data voltage of the pixel electrode PE changes due to a coupling phenomenon arising from the transition. For example, a kick-back voltage may be generated due to a coupling capacitor formed between the second gate line GL2 and the pixel electrode PE. A level of the data voltage may decrease, for example, by the level of the kick-back voltage. The aforementioned first storage electrode portion 751a reduces the capacitance of the coupling capacitor to reduce the kick-back voltage, thereby significantly reducing the variation level of the data voltage.

As illustrated in FIG. 1, the first storage electrode portion 751a is disposed along a side of the pixel electrode PE that faces the second gate line GL2. For example, when one side in the pixel electrode PE facing the first gate line GL1 corresponds to a first side of the pixel electrode PE and another side in the pixel electrode PE facing the second gate line GL2 corresponds to a second side of the pixel electrode PE, the first storage electrode portion 751a is disposed along the second side of the pixel electrode PE. The length of the first storage electrode portion 751a may be greater than or equal to the length of the first side of the pixel electrode PE.

The first storage electrode portion 751a may overlap the second side of the pixel electrode PE. An end portion of the first storage electrode portion 751a is connected to a storage electrode connecting portion 888. The storage electrode connecting portion 888 and the first storage electrode portion 751a are electrically connected to each other through a second contact hole H2.

The second storage electrode portion 751b extends from an end portion of the first storage electrode portion 751a toward the first gate line GL1. The second storage electrode portion 751b may overlap a connecting portion between the drain electrode DE and the pixel electrode PE. For example, the second storage electrode portion 751b may overlap the first contact hole H1. The second storage electrode portion 751b may be used to make a defective pixel appear as a dark spot.

For example, when a laser is irradiated to the first contact hole H1, the second storage electrode portion 751b and the pixel electrode PE are connected to each other. Accordingly, the storage voltage may be applied from the second storage electrode portion 751b to the pixel electrode PE. In such an exemplary embodiment, the pixel electrode PE and the common electrode 330 are equipotential, so that the pixel PX invariably represents a black image regardless of the applied data signal. In other words, the pixel PX becomes a dark spot. In an exemplary embodiment, through the aforementioned laser irradiation, the drain electrode DE may also be connected to the second storage electrode portion 751b.

The third storage electrode portion 751c extends toward the first gate line GL1 from another end portion of the first storage electrode portion 751a.

The fourth storage electrode portion 751d extends toward the first gate line GL1 from the first storage electrode portion 751a between one end portion of the first storage electrode portion 751a and another end portion of first storage electrode portion 751a.

Referring to FIGS. 2 and 3, the gate insulating layer 311 is on the first substrate 301, the gate electrode GE, the first gate line GL1, the second gate line GL2, and the storage electrode 751. In such an exemplary embodiment, the gate insulating layer 311 may be disposed over the entire surface of the first substrate 301, including the gate electrode GE, the first gate line GL1, the second gate line GL2, and the storage electrode 751. As illustrated in FIG. 3, the gate insulating layer 311 has a hole corresponding to the storage electrode 751.

The gate insulating layer 311 may include or be formed of silicon nitride (SiNx) or silicon oxide (SiOx). The gate insulating layer 311 may have a multilayer structure including at least two insulating layers having different physical properties.

As illustrated in FIG. 2, the semiconductor layer 321 is disposed on the gate insulating layer 311. As illustrated in FIG. 2, the semiconductor layer 321 overlaps at least a portion of the gate electrode GE. The semiconductor layer 321 may include amorphous silicon, polycrystalline silicon, or the like. In addition, the semiconductor layer 321 may include or be formed of an oxide semiconductor such as indium gallium zinc oxide (IGZO) or indium zinc tin oxide (IZTO).

The source electrode SE is on the gate insulating layer 311 and semiconductor layer 321. The source electrode SE overlaps the semiconductor layer 321 and the gate electrode GE. The source electrode SE may have a shape protruding from the first data line DL toward the gate electrode GE1. The source electrode SE and the first data line DL1 may have a unitary construction. The source electrode SE may be a portion of the first data line DL1.

The source electrode SE has a predetermined shape. For example, the source electrode SE may have one of an I-like shape, a C-like shape, or a U-like shape. In FIG. 1, a source electrode SE having a U-like shape is illustrated for illustrative purposes only. A convex portion of the source electrode SE faces toward the gate line GL2 below the pixel.

The source electrode SE may include or be formed of refractory metal, such as molybdenum, chromium, tantalum, and titanium, or an alloy thereof. The source electrode SE may have a multilayer structure including a refractory metal layer and a low-resistance conductive layer. Examples of the multilayer structure include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, source electrode SE may include or be formed of other suitable metals or conductors.

As illustrated in FIG. 3, the first data line DL1 is on the gate insulating layer 311. The first data line DL1 may have a connecting portion (e.g., an end portion) which has a larger planar area than a planar area of another portion of the first data line DL1, so as to be connected to another layer or an external driving circuit.

The first data line DL1 intersects the first gate line GL1 and the second gate line GL2. A portion of the first gate line GL1 intersecting the first data line DU may have a smaller line width than another portion of the first gate line GL1. In addition, a portion of the first data line DL1 intersecting the first gate line GL1 may have a smaller line width than another portion of the first data line DL1.

The second data line DL2 intersects the first gate line GL1 and the second gate line GL2. A portion of the first gate line GL1 intersecting the second data line DL2 may have a smaller line width than another portion of the first gate line GL1. In addition, a portion of the second data line DL2 intersecting the first gate line GL1 may have a smaller line width than another portion of the second data line DL2.

Accordingly, a parasitic capacitance among the data lines DL1 and DL2 and the gate lines GL1 and GL2 may be reduced.

The drain electrode DE is on the gate insulating layer 311 and semiconductor layer 321. The semiconductor layer 321 is spaced apart from the source electrode SE at a predetermined distance. The drain electrode DE overlaps the semiconductor layer 321 and the gate electrode GE. A channel area of the switching element is between the drain electrode DE and the source electrode SE. The drain electrode DE is connected to the pixel electrode PE. For example, the drain electrode DE is connected to an extension portion 144 of the pixel electrode PE, which extends up to the drain electrode DE from the pixel electrode PE. In such an exemplary embodiment, the drain electrode DE and the extension portion 144 are electrically connected to each other through the first contact hole H1.

The drain electrode DE may include substantially the same material and may have substantially the same structure (e.g., a multilayer structure) as the source electrode SE. The drain electrode DE and the source electrode SE may be simultaneously formed in the same process.

A first ohmic contact layer 321a is between the semiconductor layer 321 and the source electrode SE. The first ohmic contact layer 321a reduces an interfacial resistance between the semiconductor layer 321 and the source electrode SE. The first ohmic contact layer 321a may include silicide or n+ hydrogenated amorphous silicon doped with n-type impurity ions, e.g., phosphorus (P) or phosphine ($PH_3$), at high concentration.

A second ohmic contact layer 321b is between the semiconductor layer 321 and the drain electrode DE. The second ohmic contact layer 321b reduces an interfacial resistance between the semiconductor layer 321 and the drain electrode DE. The second ohmic contact layer 321b may include substantially the same material and may have substantially the same structure (e.g., multilayer structure) as those of the aforementioned first ohmic contact layer 321a. The second ohmic contact layer 321b and the first ohmic contact layer 321a may be simultaneously formed in the same process.

The semiconductor layer 321 may also be between the gate insulating layer 311 and the source electrode SE. In addition, the semiconductor layer 321 may also be between the gate insulating layer 311 and the drain electrode DE. The semiconductor layer between the gate insulating layer 311 and the source electrode SE may correspond to a first additional semiconductor layer. The semiconductor layer between the gate insulating layer 311 and the drain electrode DE may correspond to a second additional semiconductor layer. In such an exemplary embodiment, the first ohmic contact layer 321a may also be between the first additional semiconductor layer and the source electrode SE, and the second ohmic contact layer 321b may also be between the second additional semiconductor layer and the drain electrode DE.

In addition, semiconductor layer 321 may also be between the gate insulating layer 311 and each of the data lines DL1 and DL2. For example, the semiconductor layer 321 may also be between the gate insulating layer 311 and the first data line DL1. The semiconductor layer between the gate insulating layer 311 and the first data line DL1 may correspond to a third additional semiconductor layer. In such an exemplary embodiment, the first ohmic contact layer 321a may also be between the third additional semiconductor layer and the first data line DL1.

As illustrated in FIGS. 2 and 3, the passivation layer 320 is on each of the data lines DL1 and DL2, the source electrode SE, the drain electrode DE, and the gate insulating layer 311. In such an exemplary embodiment, the passivation layer 320 may be over the entire surface of the first substrate 301 including each of the data lines DL1 and DL2, the source electrode SE, the drain electrode DE, and the gate insulating layer 311. The passivation layer 320 has a first hole on the drain electrode DE and a second hole above the hole of the gate insulating layer 311. The second hole of the passivation layer 320 may be larger than the hole of the gate insulating layer 311.

The passivation layer 320 may include an inorganic insulating material such as silicon nitride ($SiN_x$) or silicon oxide ($SiO_x$). In such an exemplary embodiment, an inorganic insulating material having photosensitivity and a predetermined dielectric constant (e.g., about 4.0) may be used. In an alternative exemplary embodiment, the passivation layer 320 may have a double-layer structure including a lower inorganic layer and an upper organic layer, which is found to impart excellent insulating characteristics and does not damage an exposed portion of the semiconductor layer 321. The passivation layer 320 may have a predetermined thickness, e.g., one greater than or equal to about 5000 Å. In one embodiment, the thickness of the passivation layer 320 may be in a range of about 6000 Å to about 8000 Å.

As illustrated in FIGS. 2 and 3, the color filter 354 is on the passivation layer 320. The color filter 354 may be one of a red color filter, a green color filter, a blue color filter, or a white color filter. The color filter 354 is in the pixel area 111. In such an exemplary embodiment, an edge portion of the color filter 354 overlaps each of the gate lines GL1 and GL2 and each of the data lines DL1 and DL2. The color filter 354 has a first hole above the first hole of the passivation layer 320 and a second hole above the second hole of the passivation layer 320. The first hole of the color filter 354 is larger than the first hole of the passivation layer 320, and the second hole of the color filter 354 is larger than the second hole of the passivation layer 320. The color filter 354 may include a photosensitive organic material.

The insulating interlayer 356 is on the color filter 354 and may be over the entire surface of the first substrate 301 including the color filter 354. The insulating interlayer 356 may include an organic layer having a low dielectric constant. For example, the insulating interlayer 356 may include a photosensitive organic layer having a lower dielectric constant than the passivation layer 320. The insulating interlayer 356 has a first hole above the first hole of the color filter 354 and a second hole above the second hole of the color filter 354. The first hole of the insulating interlayer 356 is larger than the first hole of the color filter 354. The second hole of the insulating interlayer 356 is larger than the second hole of the color filter 354.

The first contact hole H1 includes the first hole of the passivation layer 320, the first hole of the color filter 354, and the first hole of the insulating interlayer 356. A portion of the drain electrode DE is exposed through the first contact hole H1. The holes of the first contact hole H1 have a larger size as positioned more upwardly. Accordingly, the extension portion 144 in an inner wall of the first contact hole H1 may have a plurality of curved portions. Accordingly, the extension portion 144 may not be damaged in the first contact hole H1 that has a large depth. For example, the extension portion 144 may be prevented from being cut.

The second contact hole H2 includes the hole of the gate insulating layer 311, the second hole of the passivation layer 320, the second hole of the color filter 354, and the second hole of the insulating interlayer 356. A portion of the storage electrode 751 is exposed through the second contact hole H2. The holes of the second contact hole H2 have a larger size as positioned more upwardly. Accordingly, the storage electrode connecting portion 888 in an inner wall of the second contact hole H2 may have a plurality of curved portions. Thus, the storage electrode connecting portion 888 may not be damaged in the second contact hole H2 that has a large depth. For example, the storage electrode connecting portion 888 may be prevented from being cut.

The pixel electrode PE and the extension portion 144 are on the insulating interlayer 356. The pixel electrode PE is connected to the drain electrode DE. For example, the extension portion 144 of the pixel electrode PE is connected to the drain electrode DE through the first contact hole H1.

One side of the pixel electrode PE facing the gate line has a longer length than a length of another side of the pixel electrode PE facing the data line. For example, one of four sides in the pixel electrode PE facing the first gate line GL1 may have a longer length than another side in the pixel electrode PE facing the first data line DL1.

The pixel electrode PE may include a transparent conductive material, e.g., indium tin oxide (ITO) or indium zinc oxide (IZO). In such an exemplary embodiment, for example, ITO may include a polycrystalline or monocrystalline material, and IZO may include a polycrystalline or monocrystalline material. Alternatively, IZO may include an amorphous material.

Figure 5:
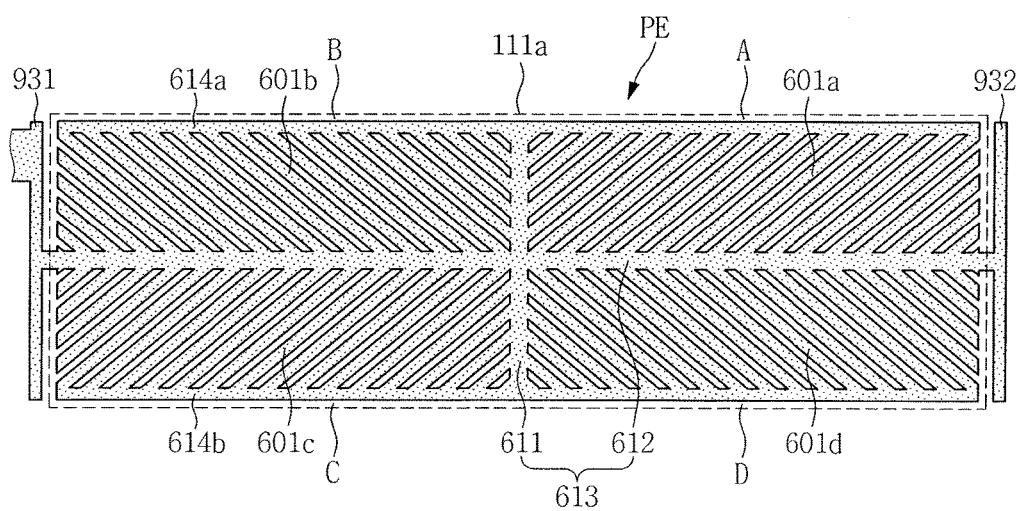
FIG. 5 illustrates an embodiment of a pixel electrode in a light emission area of FIG. 1.

FIG. 5 illustrates an embodiment of the pixel electrode PE in the light emission area 111a of FIG. 1. The pixel electrode PE includes a stem electrode 613 and a plurality of branch electrodes 601a, 601b, 601c, and 601d. The stem electrode 613 and the branch electrodes 601a, 601b, 601c, and 601d may be have a unitary construction as a single unit or body.

The stem electrode 613 divides the light emission area 111a into a plurality of domains. In an exemplary embodiment, the stem electrode 613 includes a vertical portion 611 intersecting a horizontal portion 612. The vertical portion 611 divides the light emission area 111a into two domains. The horizontal portion 612 divides each of the divided two domains into another two smaller domains. The pixel area 111 is divided into four domains A, B, C, and D by the stem electrode 613 including the vertical portion 611 and the horizontal portion 612.

The branch electrodes include first, second, third, and fourth branch electrodes 601a, 601b, 601c, and 601d respectively extending into different directions from the stem electrode 613. For example, the first, second, third, and fourth branch electrodes 601a, 601b, 601c, and 601d extend from the stem electrode 613 into corresponding ones of the domains A, B, C, and D, respectively. For example, the first branch electrode 601a is in the first domain A. The second branch electrode 601b is in the second domain B. The third branch electrode 601c is in the third domain C. And, the fourth branch electrode 601d is in the fourth domain D.

The first branch electrode 601a and the second branch electrode 601b may have a symmetrical shape with respect to the vertical portion 611. The third branch electrode 601c and the fourth branch electrode 601d may have a symmetrical shape with respect to the vertical portion 611. In addition, the first branch electrode 601a and the fourth branch electrode 601d may have a symmetrical shape with respect to the horizontal portion 612. The second branch electrode 601b and the third branch electrode 601c may have symmetrical shapes with respect to the horizontal portion 612.

The first branch electrode 601a may include a plurality of first branch electrodes 601a in the first domain A. In such an exemplary embodiment, the first branch electrodes 601a may be aligned parallel to one another. In this regard, part of the first branch electrodes 601a extend from a side of the vertical portion 611 contacting the first domain A in a diagonal direction. Other ones of the first branch electrodes 601a extend from a side of the horizontal portion 612 in the first domain A in a diagonal direction.

The second branch electrode 601b may include a plurality of second branch electrodes 601b in the second domain B. In such an exemplary embodiment, the second branch electrodes 601b may be aligned parallel to one another. In this regard, part of the second branch electrodes 601b extend from a side of the vertical portion 611 in the second domain B in a diagonal direction. In addition, other ones of the second branch electrodes 601b extend from a side of the horizontal portion 612 in the second domain B in a diagonal direction.

The third branch electrode 601c may include a plurality of third branch electrodes 601c in the third domain C. In such an exemplary embodiment, the third branch electrodes 601c may be aligned parallel to one another. Part of the third branch electrodes 601c extend from a side of the vertical portion 611 contacting the third domain C in a diagonal direction. Other ones of the third branch electrodes 601c extend from a side of the horizontal portion 612 in the third domain C in a diagonal direction.

The fourth branch electrode 601d may include a plurality of fourth branch electrodes 601d in the fourth domain D. In such an exemplary embodiment, the fourth branch electrodes 601d may be aligned parallel to one another. Part of the fourth branch electrodes 601d extend from a side of the vertical portion 611 in the fourth domain D in a diagonal direction. Further, the rest of the fourth branch electrodes 601d extend from a side of the horizontal portion 612 in the fourth domain D in a diagonal direction.

In an exemplary embodiment, the stem electrode 613 may also include a first connecting line 614a and a second connecting line 614b. The first connecting line 614a is connected to an end portion of the vertical portion 611. The second connecting line 614b is connected to another end portion of the vertical portion 611. The first connecting line 614a and the second connecting line 614b may be aligned parallel to the horizontal portion 612. The first connecting line 614a and the second connecting line 614b may be unitary with the stem electrode 613.

At least one end portion of each of the first branch electrodes 601a and at least one end portion of each of the second branch electrodes 601b are connected to the first connecting line 614b. At least one end portion of each of the third branch electrodes 601c and at least one end portion of each of the fourth branch electrodes 601d are connected to the second connecting line 614b.

In addition, at least one end portion of each of the first branch electrodes 601a and at least one end portion of each of the fourth branch electrodes 601d are connected to another connecting line. At least one end portion of each of the second branch electrodes 601b and at least one end portion of each of the third branch electrodes 601c are connected to still another connecting line. Each of the another connecting line and the still another connecting line may be connected to one end portion of the horizontal portion 612 and another end portion of the horizontal portion 612.

In an exemplary embodiment, the pixel electrode PE may further include a first compensation pattern 931 and a second compensation pattern 932 in one end portion of the horizontal portion 612 and another end portion thereof, respectively. The first compensation pattern 931 extends from the one end portion of the horizontal portion 612 to overlap the second storage electrode portion 751b. The second compensation pattern 932 extends from the another end portion of the horizontal portion 612 to overlap the third storage electrode portion 751c.

The first compensation pattern 931 and the second compensation pattern 932 significantly reduce or minimize deviation of a parasitic capacitance among pixels (pixels having shapes inverted by 180 degrees) based on variation of an overlapping area, between the pixel electrode PE and the storage electrode 751, which occurs due to mask misalignment.

For example, when the pixel electrode PE of the pixel PX moves rightwards from a normal position due to mask misalignment, an overlapping area between the first compensation pattern 931 and the second storage electrode portion 751b decreases and an overlapping area between the second compensation pattern 932 and the third storage electrode portion 751c increases. In such an exemplary embodiment, when another pixel (e.g., second pixel PX2 in FIG. 7) has a structure inverted by 180 degrees with respect to the pixel PX, an overlapping area between a first compensation pattern and a second storage electrode portion of the pixel increases due to the mask misalignment and an overlapping area between a second compensation pattern and a third storage electrode portion of the pixel decreases. Accordingly, the total overlapping area between the pixel electrode PE and the storage electrode 751 in each pixel may be substantially constantly maintained.

The extension portion 144 of the pixel electrode PE may extend from the first compensation pattern 931. For example, the aforementioned extension portion 144 may extend from the pixel electrode PE or the first compensation pattern 931. The extension portion 144, the first compensation pattern 931, and the second compensation pattern 932 may include the same material and may have the same structure as the pixel electrode PE. The pixel electrode PE, the extension portion 144, the first compensation pattern 931, and the second compensation pattern 932 may be simultaneously formed in the same process.

The storage electrode connecting portion 888 is disposed on the insulating interlayer 356. The storage electrode connecting portion 888 is connected to the storage electrode 751. The storage electrode connecting portion 888 overlaps each of the gate lines GL1 and GL2. In addition, the storage electrode connecting portion 888 may overlap each of the data lines DL1 and DL2. The storage electrode connecting portion 888 may include the same material and have the same structure as the pixel electrode PE. The storage electrode connecting portion 888 and the pixel electrode PE may be simultaneously formed in the same process.

Figure 6:
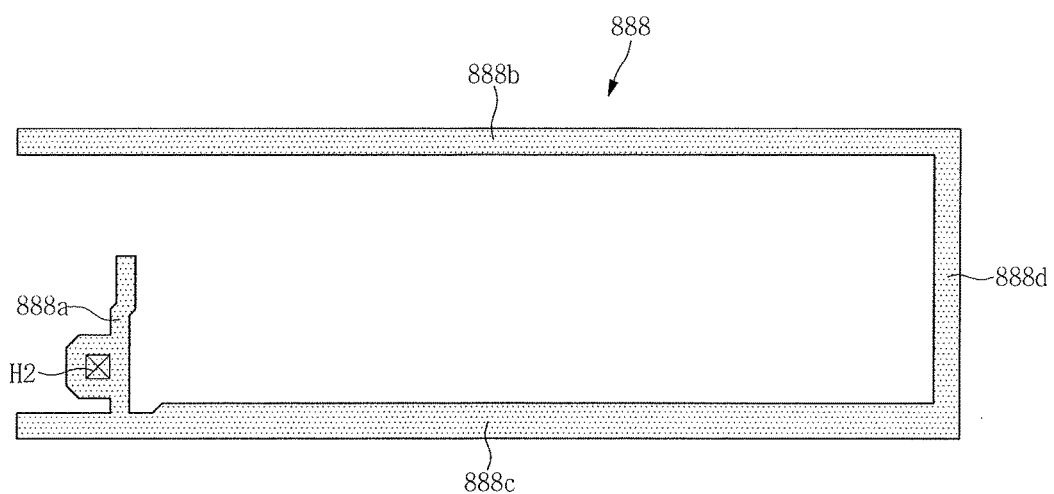
FIG. 6 illustrates an embodiment of a storage electrode connecting portion of FIG. 1.

FIG. 6 illustrates an embodiment of the storage electrode connecting portion 888 of FIG. 1. The storage electrode connecting portion 888 includes a first connecting portion 888a, a second connecting portion 888b, a third connecting portion 888c, and a fourth connecting portion 888d. The storage electrode connecting portion 888 and the pixel electrode PE may be simultaneously formed in the same process.

The first connecting portion 888a is between the first data line DL1 and the pixel electrode PE. The first connecting portion 888a is connected to the storage electrode 751. For example, the first connecting portion 888a is connected to an end portion of the first storage electrode portion 751a. As illustrated in FIG. 1, the first connecting portion 888a may overlap the gate electrode GE, source electrode SE, and semiconductor layer 321.

The second connecting portion 888b is disposed on the first gate line GL1. The second connecting portion 888b is disposed along the first gate line GL1. For example, the second connecting portion 888b overlaps an edge portion of the first gate line GL1 and is disposed along the edge portion thereof. Although not illustrated, the second connecting portion 888b may further overlap an edge portion of the pixel electrode PE. The second connecting portion 888b is substantially parallel to the first gate line GL1.

The third connecting portion 888c is disposed on the second gate line GL2. The third connecting portion 888c is disposed along the second gate line GL2. For example, the third connecting portion 888c overlaps an edge portion of the second gate line GL2 and is disposed along the edge portion thereof. The third connecting portion 888c may further overlap an edge portion of the pixel electrode PE. The third connecting portion 888c is substantially parallel to the second gate line GL2.

The fourth connecting portion 888d is disposed on the second data line DL2. For example, the fourth connecting portion 888d overlaps an edge portion of the second data line DL2 and is disposed along the edge portion thereof. Although not illustrated, the fourth connecting portion 888d may further overlap an edge portion of the pixel electrode PE. The fourth connecting portion 888d is substantially parallel to the second data line DL2.

A structure including the aforementioned second, third, and fourth connecting portions 888b, 888c, and 888d may have a U-like shape as illustrated in FIGS. 1 and 6. In detail, the structure including the second, third, and fourth connecting portions 888b, 888c, and 888d may have a shape of a U shape rotated by 90 degrees in a left or right direction.

The second connecting portion 888b and the third connecting portion 888c include a transparent material and are disposed on respective ones of the gate lines GL1 and GL2 to receive the common voltage. The second connecting portion 888b and the third connecting portion 888c prevent formation of an electric field across the pixel electrode PE and each of the gate lines GL1 and GL2. In addition, the second connecting portion 888b and the common electrode which receive the same common voltage are equipotential and the third connecting portion 888c and the common electrode 330 are equipotential. As a result, light transmitted through a portion of the liquid crystal layer 333 among the common electrode and the second and third connecting portions 888b and 888c is blocked by the second polarizer. Accordingly, light leakage may be reduced or prevented in a portion corresponding to each of the gate lines GL1 and GL2.

In addition, because the second connecting portion 888b and third connecting portion 888c may substitute for portions of the light blocking layer 376 on respective ones of the gate lines GL1 and GL2, portions of the light blocking layer 376 on respective ones of the gate lines GL1 and GL2 may be removed when the second connecting portion 888b and third connecting portion 888c are provided. Accordingly, when the storage electrode connecting portion 888 including the second connecting portion 888b and the third connecting portion 888c is provided, the aperture ratio of the pixel may further increase.

In an exemplary embodiment, the fourth connecting portion 888d may include a transparent material and may be on each of the data lines DL1 and DL2 receives the aforementioned common voltage. Accordingly, when the fourth connecting portion 888d is provided, a portion of the light blocking layer 376 on each of the data lines DL1 and DL2 may be removed in a manner described above.

The liquid crystal layer 333 includes liquid crystal molecules, e.g., homeotropic liquid crystal molecules having a negative dielectric constant.

Figure 7:
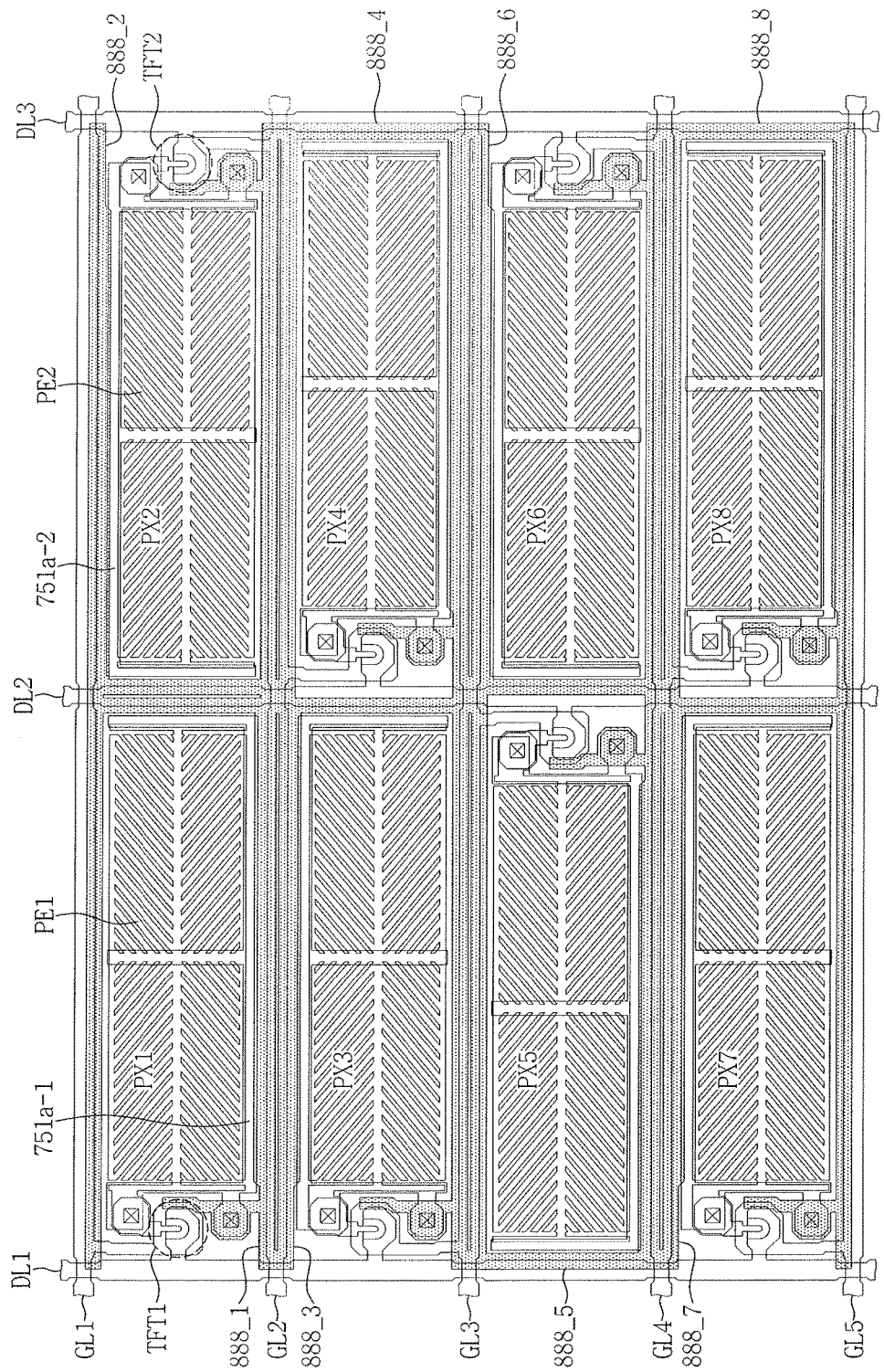
FIG. 7 illustrates an embodiment of a connecting relationship among storage electrode connecting portions in a plurality of pixels.

FIG. 7 illustrates an embodiment of a a connecting relationship among storage electrode connecting portions in a plurality of pixels. The embodiment of FIG. 7 includes first, second, third, fourth, and fifth gate lines GL1, GL2, GL3, GL4, and GL5, first, second, and third data lines DL1, DL2, and DL3, and first, second, third, fourth, fifth, sixth, seventh, and eighth pixels PX1, PX2, PX3, PX4, PX5, PX6, PX7, and PX8.

The first pixel PX1 is connected to the first gate line GL1 and the first data line DL1. A pixel electrode PE1 and a switching element TFT1 of the first pixel PX1 are in a pixel area 111 surrounded by the first gate line GL1, the second gate line GL2, the first data line DL1, and the second data line DL2. The first pixel PX1 includes a storage electrode connecting portion 888_1 (e.g., a first storage electrode connecting portion) which overlaps the first gate line GL1, the second gate line GL2, and the second data line DL2. The first pixel PX1 is substantially the same as the aforementioned pixel PX. A color filter of the first pixel PX1 may be a red color filter.

The second pixel PX2 is connected to the second gate line GL2 and the third data line DL3. A pixel electrode and a switching element of the second pixel PX2 are in a pixel area surrounded by the first gate line GL1, the second gate line GL2, the second data line DL2, and the third data line DL3. The second pixel PX2 includes a storage electrode connecting portion 888_2 (e.g., a second storage electrode connecting portion) which overlaps the first gate line GL1, the second gate line GL2, and the second data line DL2. A color filter of the second pixel PX2 may be a blue color filter.

The third pixel PX3 is connected to the third gate line GL3 and the first data line DL1. A pixel electrode and a switching element of the third pixel PX3 are in a pixel area surrounded by the second gate line GL2, the third gate line GL3, the first data line DL1, and the second data line DL2. The third pixel PX3 includes a storage electrode connecting portion 888_3 (e.g., a third storage electrode connecting portion) which overlaps the second gate line GL2, the third gate line GL3, and the second data line DL2. A color filter of the third pixel PX3 may be a green color filter.

The fourth pixel PX4 is connected to the second gate line GL2 and the second data line DL2. A pixel electrode and a switching element of the fourth pixel PX4 are in a pixel area surrounded by the second gate line GL2, the third gate line GL3, the second data line DL2, and the third data line DL3. The fourth pixel PX4 includes a storage electrode connecting portion 888_4 (e.g., a fourth storage electrode connecting portion) which overlaps the second gate line GL2, the third gate line GL3, and the third data line DL3. A color filter of the fourth pixel PX4 may be a white color filter.

The fifth pixel PX5 is connected to the third gate line GL3 and the second data line DL2. A pixel electrode and a switching element of the fifth pixel PX5 are in a pixel area surrounded by the third gate line GL3, the fourth gate line GL4, the first data line DL1, and the second data line DL2. The fifth pixel PX5 includes a storage electrode connecting portion 888_5 (e.g., a fifth storage electrode connecting portion) which overlaps the third gate line GL3, the fourth gate line GL4, and the first data line DL1. A color filter of the fifth pixel PX5 may be a blue color filter.

The sixth pixel PX6 is connected to the fourth gate line GL4 and the third data line DL3. A pixel electrode and a switching element of the sixth pixel PX6 are in a pixel area surrounded by the third gate line GL3, the fourth gate line GL4, the second data line DL2, and the third data line DL3. The sixth pixel PX6 includes a storage electrode connecting portion 888_6 (e.g., a sixth storage electrode connecting portion) which overlaps the third gate line GL3, the fourth gate line GL4, and the second data line DL2. A color filter of the sixth pixel PX6 may be a red color filter.

The seventh pixel PX7 is connected to the fifth gate line GL5 and the first data line DL1. A pixel electrode and a switching element of the seventh pixel PX7 are in a pixel area surrounded by the fourth gate line GL4, the fifth gate line GL5, the first data line DL1, and the second data line DL2. The seventh pixel PX7 includes a storage electrode connecting portion 888_7 (e.g., a seventh storage electrode connecting portion) which overlaps the fourth gate line GL4, the fifth gate line GL5, and the second data line DL2. A color filter of the seventh pixel PX7 may be a white color filter.

The eighth pixel PX8 is connected to the fourth gate line GL4 and the second data line DL2. A pixel electrode and a switching element of the eighth pixel PX8 are in a pixel area surrounded by the fourth gate line GL4, the fifth gate line GL5, the second data line DL2, and the third data line DL3. The eighth pixel PX8 includes a storage electrode connecting portion 888_8 (e.g., an eighth storage electrode connecting portion) which overlaps the fourth gate line GL4, the fifth gate line GL5, and the third data line DL3. A color filter of the eighth pixel PX8 may be a green color filter.

As illustrated in FIG. 7, the storage electrode connecting portions in adjacent pixels may be connected to one another. For example, the fourth storage electrode connecting portion 888_4 may be connected to the second storage electrode connecting portion 888_2, the third storage electrode connecting portion 888_3, and the sixth storage electrode connecting portion 888_6. A storage electrode connecting portion of another pixel in a right side of the fourth pixel PX4 is connected to the fourth storage electrode connecting portion 888_4.

The first pixel PX1 and the second pixel PX2 are connected to different gate lines, respectively. For example, a switching element TFT1 (e.g., a first switching element) of the first pixel PX1 is connected to the first gate line GL1, and a switching element TFT2 (e.g., a second switching element) of the second pixel PX2 is connected to the second gate line GL2. In addition, a first storage electrode portion 751a-1 (e.g., an (1-1)-th storage electrode portion) of the first pixel PX1 is more adjacent to the second gate line GL2 between the two gate lines GL1 and GL2, and a first storage electrode portion 751a-2 (e.g., a (2-1)-th storage electrode portion) of the second pixel PX2 is more adjacent to the first gate line GL1 between the two gate lines GL1 and GL2. Due to the structural difference, deviation of a kick-back voltage between the first pixel PX1 and the second pixel PX2 may decrease.

First, when a gate high voltage is applied to the first gate line GL1, the first switching element TFT1 is turned on. A data voltage is applied from the first data line DL1 to the first pixel electrode PE1 by the first switching element TFT1 that is turned on. Subsequently, a gate low voltage is applied to the first gate line GL1 such that the first switching element TFT1 is turned off. Accordingly, the data voltage is stored in the first pixel electrode PE1.

In such an exemplary embodiment, when the voltage of the first gate line GL1 transitions from the gate high voltage to the gate low voltage, the data voltage of the first pixel electrode PE1 and a data voltage of the second pixel electrode PE2 are changed due to a kick-back voltage (e.g., a first kick-back voltage) based on the aforementioned coupling phenomenon.

The data voltage of the second pixel electrode PE2 is reset to an initial data voltage when the second gate line GL2 is driven. Thus, a variation of the data voltage of the second pixel electrode PE2 may not cause a practical problem. For example, the data voltage of the first pixel electrode PE1 is a present data voltage and the data voltage of the second pixel electrode PE2 is a past data voltage. Thus, the present data voltage affected by the first kick-back voltage based on a gate signal (e.g., a pulse signal including the gate high voltage and the gate low voltage) applied to the first gate line GL1, is the data voltage of the first pixel electrode PE1.

In addition, the (2-1)-th storage electrode portion 751a-2 is adjacent to the first gate line GL1 and a capacitance of the coupling capacitor between the first gate line GL1 and the second pixel electrode PE2 is significantly small. Accordingly, when the first gate line GL1 is driven, the data voltage of the first pixel electrode PE1 is affected by the first kick-back voltage, and the data voltage of the second pixel electrode PE2 is not substantially affected by the first kick-back voltage.

Subsequently, when a gate high voltage is applied to the second gate line GL2, the second switching element TFT2 is turned on. A data voltage is applied from the third data line DL3 to the second pixel electrode PE2 by the second switching element TFT2 that is turned on. Subsequently, a gate low voltage is applied to the second gate line GL2 such that the second switching element TFT2 is turned off. Accordingly, the data voltage is stored in the second pixel electrode PE2.

In such an exemplary embodiment, when the voltage of the second gate line GL2 transitions from the gate high voltage to the gate low voltage, the data voltage of the first pixel electrode PE1 and the data voltage of the second pixel electrode PE2 are changed due to a kick-back voltage (e.g., a second kick-back voltage) based on the aforementioned coupling phenomenon.

In such an exemplary embodiment, the (1-1)-th storage electrode portion 751a-1 is adjacent to the second gate line GL2 and a capacitance of the coupling capacitor between the second gate line GL2 and the first pixel electrode PE1 is significantly small.

Accordingly, when the second gate line GL2 is driven, the data voltage of the second pixel electrode PE2 is affected by the second kick-back voltage, and the data voltage of the first pixel electrode PE1 is not substantially affected by the second kick-back voltage. As such, each of the first pixel PX1 and the second pixel PX2 is affected by one of the kick-back voltages. Thus, a kick-back voltage deviation between the first pixel PX1 and the second pixel PX2 may be significantly reduced.

Figure 8:
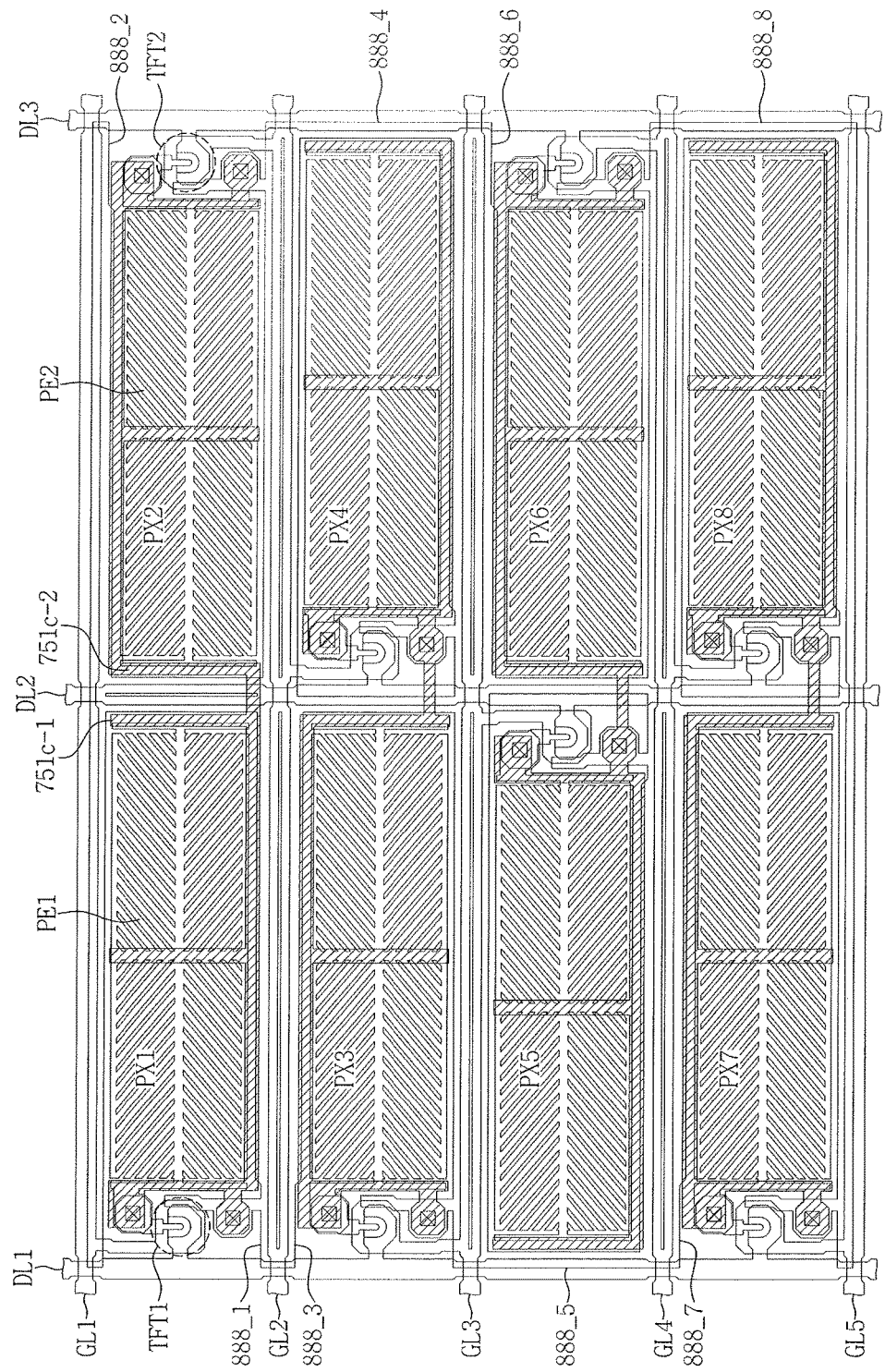
FIG. 8 illustrates an embodiment of a connecting relationship among storage electrode connecting portions in a plurality of pixels.

FIG. 8 illustrates an embodiment of a connecting relationship among storage electrodes in a plurality of pixels. Respective storage electrodes of pixels adjacently disposed with a data line therebetween may be connected to each other. For example, a storage electrode 751 of a first pixel PX1 may be connected to a storage electrode of a second pixel PX2. A third storage electrode portion 751c-1 of the storage electrode 751 in the first pixel PX1 may be connected to a third storage electrode portion 751c-2 of the storage electrode in the second pixel PX2. As another example, a third storage electrode portion of a storage electrode in a third pixel PX3 may be connected to a second storage electrode portion of a storage electrode in a fourth pixel PX4.

Respective convex portions of source electrodes in respective pixels face a same direction. For example, as illustrated in FIG. 7, a convex portion of a source electrode SE in each pixel faces toward a gate line below the corresponding pixel. For example, a convex portion of a source electrode SE of the first pixel PX1 and a convex portion of a source electrode of the second pixel PX2 face a second gate line GL2. A convex portion of a source electrode of the third pixel PX3 and a convex portion of a source electrode of the fourth pixel PX4 face a third gate line GL3. A convex portion of a source electrode of a fifth pixel PX5 and a convex portion of a source electrode of a sixth pixel PX6 face a fourth gate line GL4. A convex portion of a source electrode of a seventh pixel PX7 and a convex portion of a source electrode of an eighth pixel PX8 face a fifth gate line GL5. Because all of the respective source electrodes of the pixels face the same direction, a characteristic deviation among switching elements may be significantly reduced. For example, a size deviation of respective parasitic capacitors in pixels may be significantly reduced.

In an exemplary embodiment, configurations of the first, second, third, fourth, fifth, sixth, seventh, and eighth pixels PX1, PX2, PX3, PX4, PX5, PX6, PX7, and PX8 may be the same as the configurations of the above described pixels.

Figure 9:
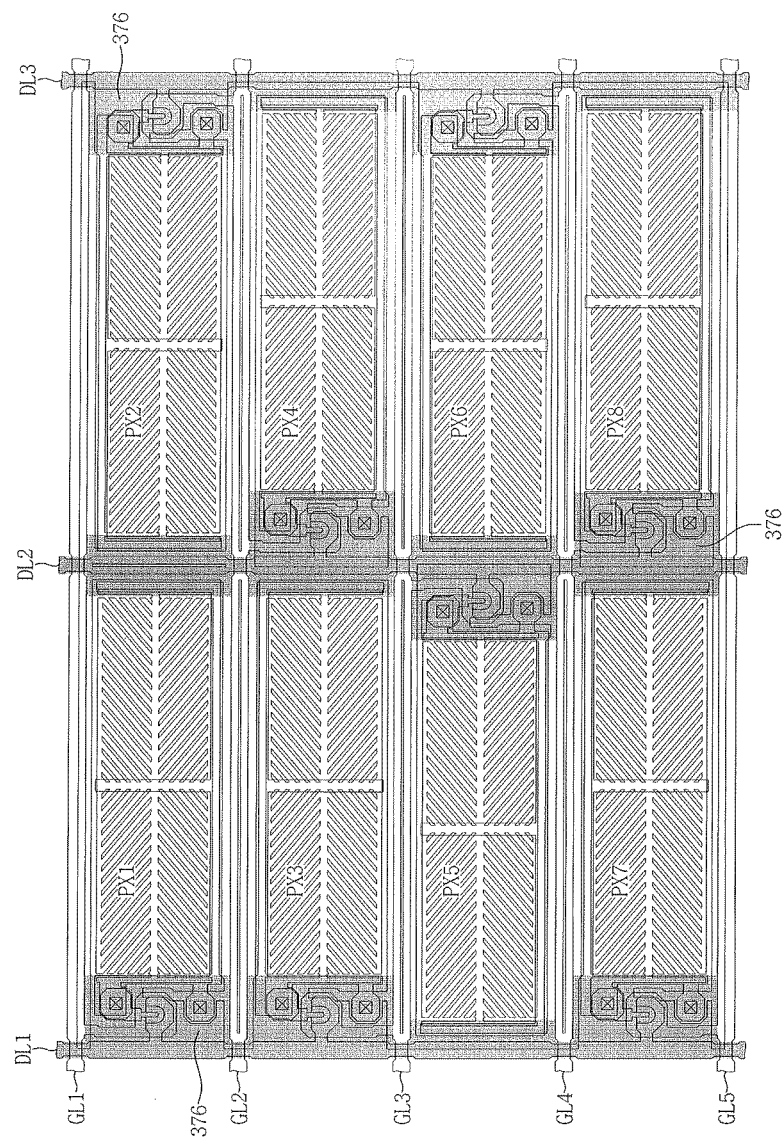
FIG. 9 illustrates an example of a position of a light blocking layer.

FIG. 9 illustrates an embodiment of a position of a light blocking layer 376 in a plan view. The light blocking layer 376 is on a light blocking area 111b of each pixel area 111 and each of data lines DL1, DL2, and DL3. Due to the aforementioned storage electrode connecting portion 888, the light blocking layer 376 may not be on each of gate lines GL1, GL2, GL3, GL4, and GL5.

In accordance with one or more of the aforementioned exemplary embodiments, a display device may have the following effects. First, the display device may reduce a kick-back voltage difference among pixels. Accordingly, image sticking and defects such as vertical moving lines may be reduced and image quality may be improved. Second, a storage electrode connecting portion that receives a common voltage and includes a transparent material is on each gate line. The storage electrode connecting portion may substitute for a portion of a light blocking layer on the gate line. As a result, an aperture ratio of a pixel may increase.

Example embodiments have been disclosed herein, and although specific terms are employed, they are used and are to be interpreted in a generic and descriptive sense only and not for purpose of limitation. In some instances, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a plurality of pixels, at least one of the pixels including:
a pixel electrode in a pixel area defined by a first gate line, a second gate line, a first data line, and a second data line;
a switch connected to the first gate line, the first data line, and the pixel electrode;
a storage electrode adjacent to the pixel electrode; and
a storage electrode connecting portion connected to the storage electrode and overlapping at least one of the first gate line or the second gate line, at least a portion of the storage electrode connecting portion substantially parallel to the overlapped one of the first gate line or the second gate line.

2. The display device as claimed in claim 1, wherein the storage electrode connecting portion includes:

a first connecting portion between the first data line and the pixel electrode and connected to the storage electrode;
a second connecting portion overlapping the first gate line;
a third connecting portion overlapping the second gate line; and
a fourth connecting portion overlapping the second data line.

3. The display device as claimed in claim 2, wherein the fourth connecting portion is substantially parallel to the second data line.

4. The display device as claimed in claim 1, wherein the storage electrode connecting portion and the pixel electrode are on a same layer.

5. The display device as claimed in claim 1, wherein respective storage electrode connecting portions of the pixels are connected to one another.

6. The display device as claimed in claim 1, wherein the storage electrode includes a first storage electrode portion that is more adjacent to the second gate line between the first gate line and the second gate line.

7. The display device as claimed in claim 6, wherein an end portion of the first storage electrode portion is connected to the storage electrode connecting portion.

8. The display device as claimed in claim 6, wherein the first storage electrode portion is along a side of the pixel electrode that faces the second gate line.

9. The display device as claimed in claim 6, wherein the storage electrode further includes at least one of:
a second storage electrode portion extending from one end portion of the first storage electrode portion toward the first gate line;
a third storage electrode portion extending from another end portion of the first storage electrode portion toward the first gate line; and
a fourth storage electrode portion extending from the first storage electrode portion between the one end portion and the another end portion toward the first gate line.

10. The display device as claimed in claim 9, wherein at least one of the first, second, third, or fourth storage electrode portions overlaps the pixel electrode.

11. The display device as claimed in claim 1, wherein the switch includes:
a gate electrode connected to the first gate line,
a source electrode connected to the first data line, and
a drain electrode connected to the pixel electrode.

12. The display device as claimed in claim 11, wherein the source electrode of the switch has substantially a U shape.

13. The display device as claimed in claim 12, wherein respective convex portions of the source electrodes in the respective pixels face a same direction.

14. The display device as claimed in claim 1, wherein respective storage electrodes of pixels that are disposed adjacent to each other with the first data line or the second data line therebetween are connected to each other.

15. The display device as claimed in claim 9, wherein a third storage electrode portion included in one of two pixels that are disposed adjacent to each other with the second data line therebetween and a third storage electrode portion included in another of the two pixels are connected to each other.

16. The display device as claimed in claim 9, wherein a first storage electrode portion included in one of two pixels that are disposed adjacent to each other with the first data line therebetween and a third storage electrode portion included in another of the two pixels are connected to each other.

17. The display device as claimed in claim 1, further comprising:
an insulating layer between the storage electrode and the storage electrode connecting portion, the insulating layer including a contact hole to connect the storage electrode and the storage electrode connecting portion.

18. The display device as claimed in claim 1, wherein the storage electrode connecting portion includes a transparent conductive material.

19. The display device as claimed in claim 1, further comprising:
a light blocking layer on the first data line, second data line, and switch.

20. The display device as claimed in claim 1, wherein another pixel of the plurality of pixels includes:
another pixel electrode in another pixel area defined by the first gate line, the second gate line, the second data line, and a third data line; and
another storage electrode adjacent to the another pixel electrode.

21. The display device as claimed in claim 20, wherein the another storage electrode includes another first storage electrode portion more adjacent to the first gate line between the first gate line and the second gate line.

22. The display device as claimed in claim 1, wherein one side of the pixel electrode facing the first gate line is a longer than another side of the pixel electrode facing the first data line.

23. The display device as claimed in claim 1, wherein the first gate line is to be driven prior to the second gate line in a single frame period.

* * * * *